United States Patent
Kariya

(12) 
(10) Patent No.: US 6,236,105 B1
(45) Date of Patent: *May 22, 2001

(54) SEMICONDUCTOR DEVICE WITH IMPROVED PLANARITY ACHIEVED THROUGH INTERLAYER FILMS WITH VARYING OZONE CONCENTRATIONS

(75) Inventor: Atsushi Kariya, Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/936,517

(22) Filed: Sep. 24, 1997

(30) Foreign Application Priority Data

Oct. 9, 1996 (JP) .................................................. 9-268657

(51) Int. Cl.$^7$ .................................................. H01L 23/58
(52) U.S. Cl. .......................... 257/634; 257/635; 257/760; 438/790
(58) Field of Search .................................. 438/624, 787, 438/790, 632; 257/760, 634, 635; 251/760

(56) References Cited

U.S. PATENT DOCUMENTS

| | | | |
|---|---|---|---|
| 5,051,380 | * 9/1991 | Maeda et al. | 438/238 |
| 5,424,253 | 1/1993 | Usami et al. | 438/763 |
| 5,462,899 | * 10/1995 | Ikeda | 438/238 |
| 5,525,551 | * 6/1996 | Ohta | 438/238 |
| 5,563,104 | * 10/1996 | Jang et al. | 438/235 |
| 5,637,924 | * 6/1997 | Hibino | 257/751 |
| 5,726,497 | * 3/1998 | Chao et al. | 257/758 |
| 5,804,509 | * 9/1998 | Cho | 438/790 |
| 5,811,343 | * 9/1998 | Wann et al. | 438/305 |
| 5,830,797 | * 11/1998 | Cleeves | 438/296 |
| 5,859,458 | * 1/1999 | Hsueh et al. | 257/347 |

FOREIGN PATENT DOCUMENTS

| | | |
|---|---|---|
| 2 298 658 | 9/1996 | (GB) . |
| 3-120825 | 5/1991 | (JP) . |
| 3-198340 | 8/1991 | (JP) . |
| 4-94539 | 3/1993 | (JP) . |
| 5-259297 | 8/1993 | (JP) . |
| 5-259155 | 10/1993 | (JP) . |
| 6-69192 | 3/1994 | (JP) . |
| 8-8336 | 1/1996 | (JP) . |

OTHER PUBLICATIONS

Japanese Office Action dated Jan. 19, Hei 11 with English language translation of Japanese Examiner's comments.

Japanese Office Action dated Aug., 1998 with English language translation of Japanese Examiner's comments.

European Search Jan. 29, 1998.

* cited by examiner

Primary Examiner—Olik Chaudhuri
Assistant Examiner—Kurt Eaton
(74) Attorney, Agent, or Firm—McGuireWoods, LLP

(57) ABSTRACT

A semiconductor device includes an interlayer insulating film disposed between upper and lower wiring layers, the interlayer insulating film having a two-layered structure including an upper insulating film and a lower insulating film, the upper insulating film is formed in an ozone ($O_3$) concentration higher than that of the lower insulating film. The interlayer insulating film may be composed, for example, of $O_3$ tetra etyl ortho silicate (TEOS) boron phospho silicate glass (BPSG). The semiconductor device makes it possible to have the interlayer insulating film sufficiently planarized by a reflow process, and to prevent precipitation of impurities at a surface of the interlayer insulating film. Alternatively, the interlayer insulating film may have a multi-layered structure including a three or more of insulating films, in which a top insulating film is formed in a higher ozone concentration than that of the other insulating films.

8 Claims, 4 Drawing Sheets

SEMICONDUCTOR DEVICE WITH IMPROVED PLANARITY ACHIEVED THROUGH INTERLAYER FILMS WITH VARYING OZONE CONCENTRATIONS

BACKGROUND OF THE INVENTION

1. Field of the Invention

The invention relates to a semiconductor device and a method of fabricating the same, and more particularly to an improvement in an interlayer insulating film suitable for a semiconductor device having multi-layered wirings.

2. Description of the Related Art

Recently, integration in a semiconductor device has been significantly enhanced. With such enhancement in integration, a semiconductor device is designed to have a multi-layered wiring structure including a growing number of wiring layers. A semiconductor device is designed to have an insulating film around or between wiring layers for prevention of current leakage. In particular, an insulating film formed between wiring layers is called an interlayer insulating film. As mentioned above, under the circumstance that steps on a surface of a semiconductor substrate on which a wiring layer(s) is(are) formed are increased with a wiring layer in a semiconductor device being designed to have a multi-layered wiring structure having the growing number of layers, it is indispensable that such surface steps are planarized by means of an interlayer insulating film.

In order to planarize steps formed on a surface of a semiconductor substrate, the following method is presently and widely used in the field of semiconductor fabrication.

First, a wiring pattern made of aluminum is formed on a semiconductor substrate such as a silicon substrate, and then, a film made of ozone ($O_3$) tetra etyl ortho silicate (TEOS) boron phospho silicate glass (BPSG) is formed all over the semiconductor substrate by normal pressure chemical vapor deposition (CVD). Then, the semiconductor substrate is annealed, for instance, at 800° C. to 900° C. in nitrogen ($N_2$) atmosphere to thereby reflow the $O_3$ TEOS BPSG film.

One conventional method of forming a $O_3$ TEOS BPSG film is illustrated in FIGS. 1A to 1C.

First, as illustrated in FIG. 1A, a polysilicon film 11 is formed on a silicon substrate 10 and patterned. Then, a film 12 made of $O_3$ TEOS BPSG containing boron (B) and phosphorus (P) at a relatively low concentration is formed over the patterned polysilicon film 11 and the silicon substrate 10 by normal pressure CVD.

Then, as illustrated in FIG. 1B, a film 13 made of $O_3$ TEOS BPSG containing boron (B) and phosphorus (P) at a relatively high concentration is formed over the $O_3$ TEOS BPSG film 12.

Then, as illustrated in FIG. 1C, the silicon substrate 10 is subject to heat treatment by exposing to nitrogen ($N_2$) atmosphere at 800° C. to 900° C., to thereby reflow the $O_3$ TEOS BPSG films 12 and 13.

Japanese Unexamined Patent Publication No. 4-94539 has suggested another method of planarizing surface steps of a semiconductor substrate. In the suggested method, a surface of a substrate is first reformed by irradiating high frequency plasma thereto. Then, there are formed PSG film, BSG film and BPSG film on the substrate under normal or lowered pressure by employing a mixture gas containing an organic silane ($SiH_4$), a gas containing impurities such as phosphorus and boron, and ozone.

Japanese Unexamined Patent Publication No. 5-259297 has suggested still another method of planarizing surface steps of a semiconductor substrate. In this method, prior to formation of an interlayer insulating film, there is formed a nitrogen containing layer which is to be disposed just below the interlayer insulating film.

However, the above-mentioned prior methods have a problem as follows.

It is well known that a $O_3$ TEOS BPSG film, formed by normal pressure CVD, containing boron (B) and phosphorus (P) at higher concentration would provide more excellent planarization of surface steps on a substrate. On the other hand, if a $O_3$ TEOS BPSG film contains boron (B) and phosphorus (P) at high concentration, there takes place a phenomenon that boron and phosphorus particles are precipitated at a surface of the $O_3$ TEOS BPSG film. Such precipitation of boron and phosphorus particles on a surface of a $O_3$ TEOS BPSG film exerts a harmful influence on subsequent steps, resulting in reduction in a yield. That is, the above-mentioned prior methods have a problem of a narrow margin with respect to boron and phosphorus concentrations.

In other words, the prior methods have a problem that it is not allowed to let a $O_3$ TEOS BPSG film contain boron and phosphorus at high concentration because of low limit thereof about precipitation of boron and phosphorus, resulting in that the $O_3$ TEOS BPSG film cannot be sufficiently planarized after being reflowed.

To the contrary, if a $O_3$ TEOS BPSG film were designed to contain boron and phosphorus at higher concentration in order to sufficiently planarize the $O_3$ TEOS BPSG film by reflow process, it would be accompanied with a problem that boron and phosphorus particles precipitate at a surface of the $O_3$ TEOS BPSG film.

SUMMARY OF THE INVENTION

In view of the foregoing problems of the prior methods, it is an object of the present invention to provide a semiconductor device and a method of fabricating the same both of which are capable of sufficiently planarizing an interlayer insulating film by reflow process and preventing precipitation of impurities at a surface of the interlayer insulating film.

In one aspect, there is provided a semiconductor device including an interlayer insulating film disposed between upper and lower wiring layers, the interlayer insulating film having a two-layered structure including an upper insulating film and a lower insulating film, the lower insulating film being formed by an ozone ($O_3$)-TEOS reaction in an atmosphere containing a first concentration of ozone and the upper insulating film being formed by an $O_3$-TEOS reaction in an atmosphere containing a second concentration of ozone ($O_3$) concentration different from that of the lower insulating film.

There is further provided a semiconductor device including an interlayer insulating film disposed between upper and lower wiring layers, the interlayer insulating film having a two-layered structure including an upper insulating film and a lower insulating film, the upper insulating film being formed in an atmosphere of ozone ($O_3$) having a concentration higher than that of the concentration of ozone in the atmosphere in which the lower insulating film was formed.

For instance, the upper insulating film may have been formed in an ozone concentration ranging from 120 to 140 mg/litter both inclusive, and the lower insulating film may have been formed in an ozone concentration ranging from 70 to 100 mg/litter both inclusive.

There is still further provided a semiconductor device including an interlayer insulating film disposed between upper and lower wiring layers, the interlayer insulating film having a multi-layered structure including a plurality of insulating films, the insulating films having been formed in an ozone ($O_3$) concentration different from that of one another.

It is preferable an insulating film in the multi-layered structure, disposed on another insulating film formed using a higher ozone concentration than that of the another insulating film. It is also preferable that a top insulating film has the highest ozone concentration among all of the insulating films.

The interlayer insulating film may be composed of any electrically insulating material. It is preferable that the interlayer insulating film is composed of $O_3$ tetra etyl ortho silicate (TEOS) boron phospho silicate glass (BPSG).

In another aspect, there is provided a method of fabricating a semiconductor device, including the step of forming an interlayer insulating film between upper and lower wiring layers so that the interlayer insulating film has a two-layered structure including an upper insulating film and a lower insulating film, in which the lower insulating film is formed in accordance with an ozone ($O_3$)-TEOS reaction in an atmosphere containing a first concentration of ozone and the upper insulating film is formed by an $O_3$-TEOS reaction in an atmosphere containing a second concentration of ozone.

There is further provided a method of fabricating a semiconductor device, including the step of forming an interlayer insulating film between upper and lower wiring layers so that the interlayer insulating film has a two-layered structure including an upper insulating film and a lower insulating film, in which the upper insulating film is formed in ozone ($O_3$) concentration higher than that of the lower insulating film.

It is preferable that the lower and upper insulating films are successively formed. The interlayer insulating film may be composed of any electrically insulating material, however, it is preferable that the interlayer insulating film is composed of $O_3$ tetra etyl ortho silicate (TEOS) boron phospho silicate glass (BPSG).

There is still further provided a method of fabricating a semiconductor device comprising the step of forming an interlayer insulating film between upper and lower wiring layers so that the interlayer insulating film has a multi-layered structure including a plurality of insulating films, in which the insulating films are formed in an ozone ($O_3$) concentration different from that of one another.

In the above-mentioned multi-layered structure, it is preferable that an insulating film disposed on another insulating film is formed in a higher ozone concentration than that of the another insulating film. It is also preferable that the plurality of insulating films are successively formed.

As mentioned above, in accordance with the present invention, an interlayer insulating film disposed between upper and lower wiring layers is designed to have a multi-layered structure, for instance, a two-layered structure. The layers constituting the interlayer insulating layer are formed in different concentrations with respect to ozone. For instance, an upper film is formed in a higher concentration of ozone than that of a lower film in the two-layered structure. Hence, the interlayer insulating layer totally has a high concentration of impurities such as boron (B) and phosphorus (P), which ensures the interlayer insulating film can be sufficiently planarized by reflow process.

In addition, by designing an upper film in a higher concentration of ozone than that of a lower film in the two-layered interlayer insulating film, the upper film could have a higher amount of oxygen to thereby facilitate oxidation, which ensures stable film quality. As a result, even if an interlayer insulating film containing impurities such as boron and phosphorus at higher concentration than a conventional interlayer insulating film, it would be possible to prevent precipitation of impurity particles at a surface of the interlayer insulating film after the interlayer insulating film is reflowed, unlike the conventional interlayer insulating films.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

The first embodiment is explained hereinbelow with reference to FIGS. 2A to 2C.

In the first embodiment, a $O_3$ TEOS BPSG film used for planarizing an interlayer insulating film formed between upper and lower wiring layers 1 and 5 in a semiconductor device is designed to have a two-layered structure including upper and lower films. The upper film is formed in an ozone ($O_3$) concentration higher than that of the lower film.

The reason for designing the upper film in an ozone ($O_3$) concentration higher than that of the lower film is as follows. For instance, if an interlayer insulating film were wholly increased in an atmosphere containing an ozone concentration from 70 mg/litter to 130 mg/litter, a film deposition rate would be reduced by about 10% with the result of reduction in throughput. Hence, it would be possible to prevent the reduction in throughput by increasing the ozone concentration for only the upper film in the two-layered $O_3$ TEOS BPSG film.

The steps for fabricating the $O_3$ TEOS BPSG film are explained hereinbelow with reference to FIGS. 2A to 2C.

Figure 2A:
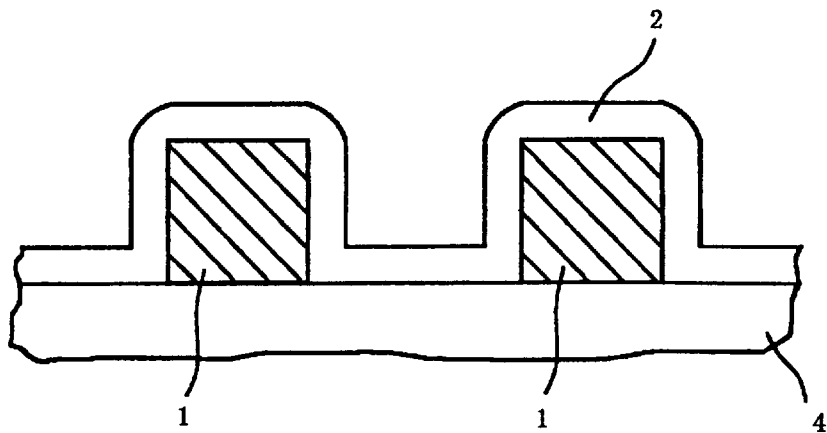
FIGS. 2A to 2C are cross-sectional views of a semiconductor device, illustrating respective steps of methods of fabricating the same in accordance with the first and second embodiments.

First, as illustrated in FIG. 2A, a polysilicon film 1 is formed on a silicon substrate 4 and patterned. Then, a film 2 made of $O_3$ TEOS BPSG containing ozone ($O_3$) at a relatively low concentration is formed over the patterned polysilicon film 1 and the silicon substrate 4 in a certain reaction chamber by normal pressure chemical vapor deposition. In the instant embodiment, the $O_3$ TEOS BPSG film 2 is formed an ozone concentration in the range of 70 mg/litter to 100 mg/litter. The patterned polysilicon film 1 is completely covered with the $O_3$ TEOS BPSG film 2. The $O_3$ TEOS BPSG film 2 formed over the polysilicon film 1 and having a relatively low ozone concentration would be a lower film in a two-layered interlayer insulating film.

Figure 2B:
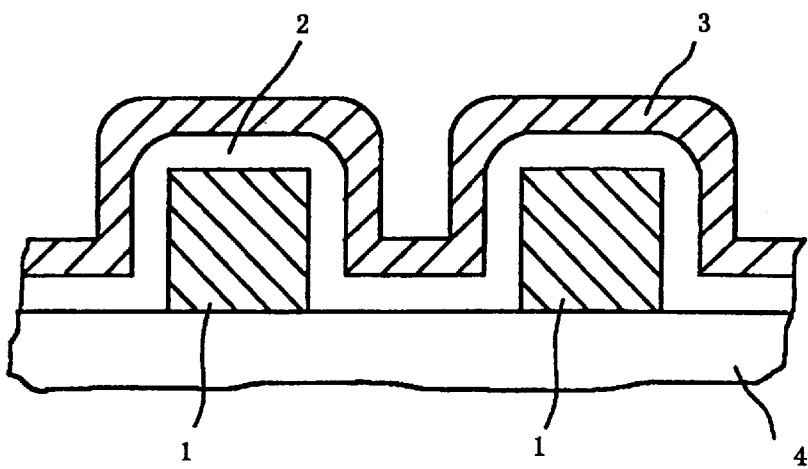
Figure 2C:
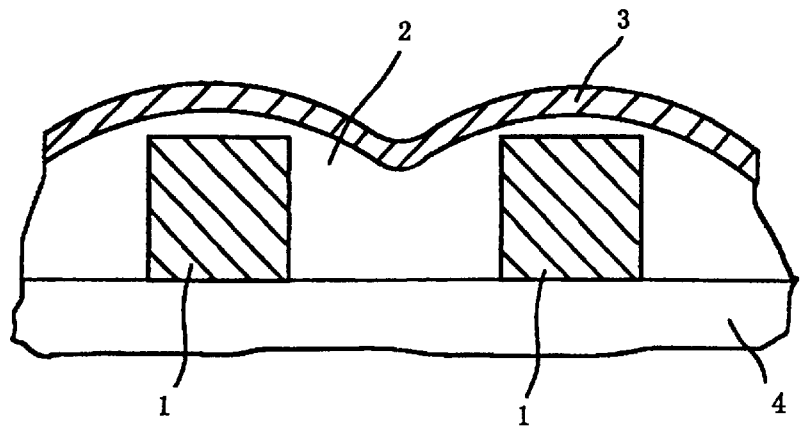

Then, as illustrated in FIG. 2B, a film 3 made in $O_3$ TEOS BPSG containing ozone ($O_3$) at a relatively high concentration is formed all over the $O_3$ TEOS BPSG film 2 in the same reaction chamber. In the instant embodiment, the $O_3$ TEOS BPSG film 3 is formed in an ozone concentration in the range of 120 mgl/litter to 140 mg/litter, which is higher than the ozone concentration of the $O_3$ TEOS BPSG film 2. The $O_3$ TEOS BPSG film 3 formed over the $O_3$ TEOS BPSG film 2 and having a relatively high ozone concentration would be an upper film in the two-layered interlayer insulating film.

Then, the lower and upper $O_3$ TEOS BPSG films 2 and 3 are subject to heat treatment by exposing to nitrogen ($N_2$) atmosphere at 800° C. to 900° C. for about 10 minutes, to thereby reflow the lower and upper $O_3$ TEOS BPSG films 2 and 3. Thus, the lower and upper $O_3$ TEOS BPSG films 2 and 3 both of which cooperate with each other to form an interlayer insulating film to be disposed between the lower wiring layer 1 and an upper wiring layer (not illustrated) are planarized, as illustrated in FIG. 2C.

Figure 1A:
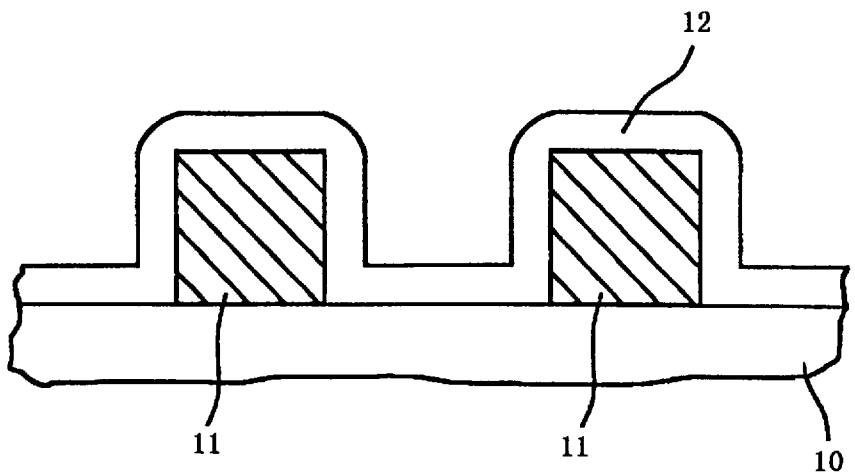
FIGS. 1A to 1C are cross-sectional views of a semiconductor device, illustrating respective steps of a conventional method of fabricating the same.
Figure 1B:
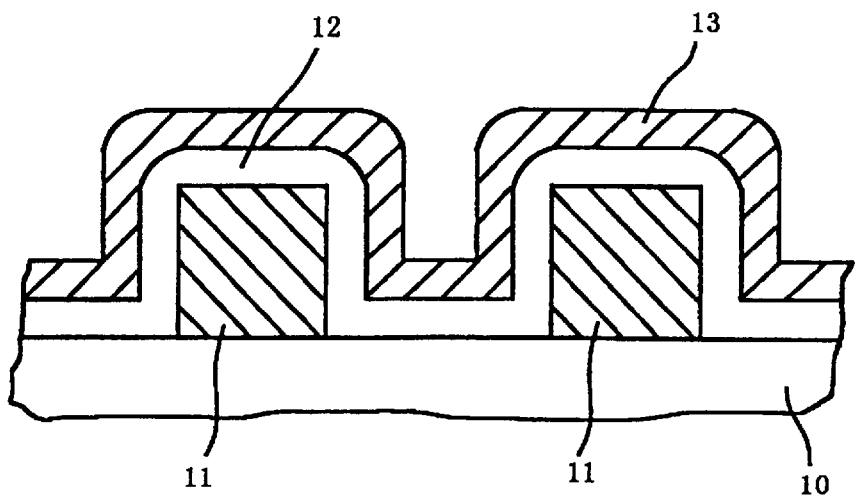
Figure 1C:
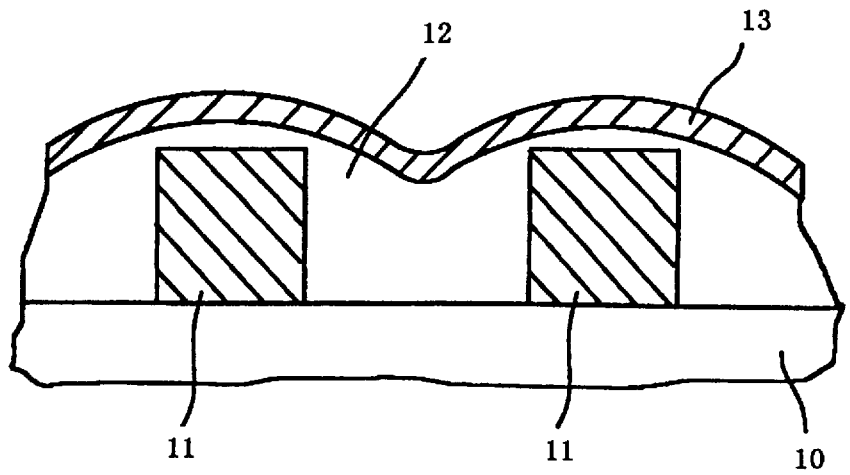
Figure 3A:
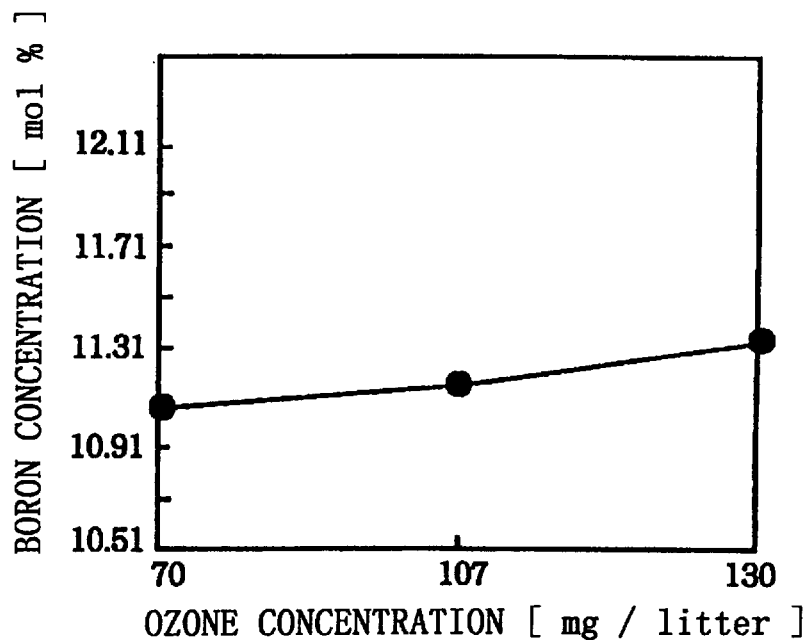
FIG. 3A is a graph showing a relation between boron concentration and ozone concentration in the first embodiment.
Figure 3B:
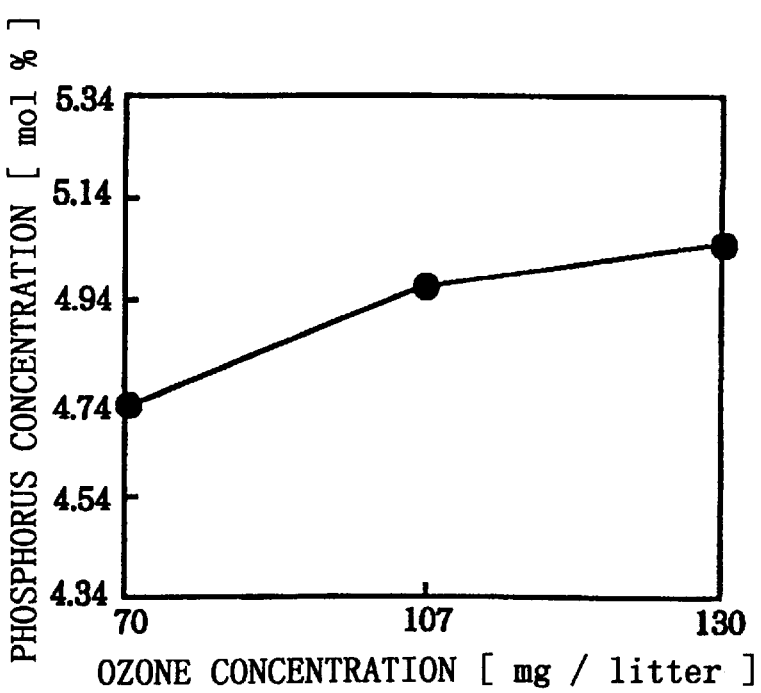
FIG. 3B is a graph showing a relation between phosphorus concentration and ozone concentration in the first embodiment.
Figure 4A:
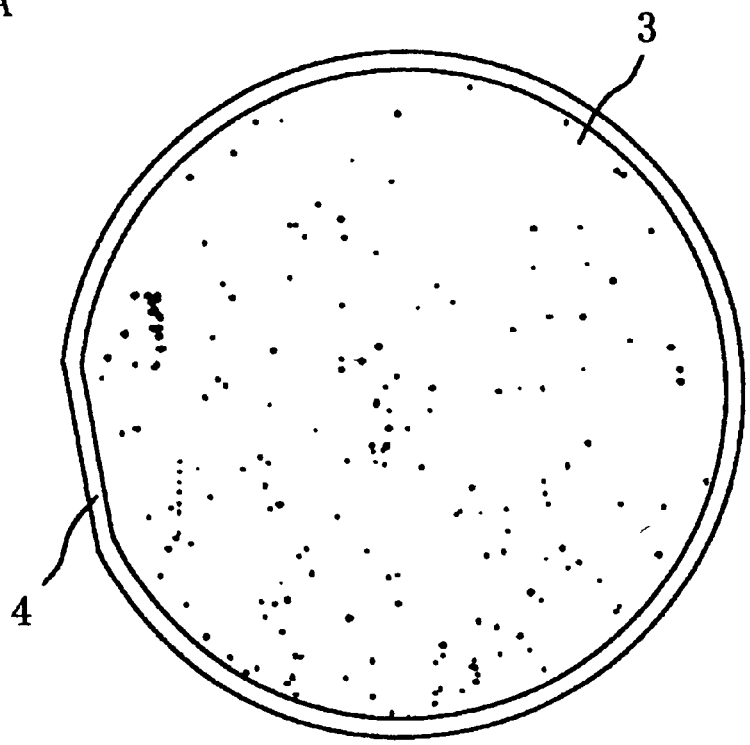
FIG. 4A illustrates the result of observing precipitation of boron and phosphorus at a surface of the $O_3$ TEOS BPSG film formed by the method in accordance with the first embodiment of the present invention.
Figure 4B:
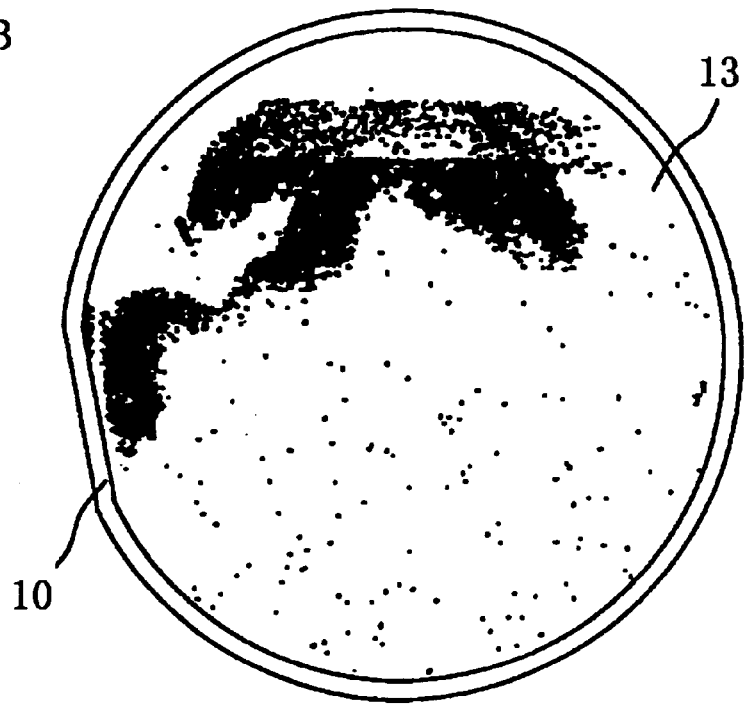
FIG. 4B illustrates the result of observing precipitation of boron and phosphorus at a surface of the $O_3$ TEOS BPSG film formed by a conventional method.

FIG. 3A shows a relation between boron concentration [mol %] and ozone concentration [mg/litter], and FIG. 3B shows a relation between phosphorus concentration [mol %] and ozone concentration [mg/litter] both in the first embodiment. FIG. 4A illustrates the result of observing precipitation of boron and phosphorus at a surface of the upper $O_3$ TEOS BPSG film 3 formed by the above-mentioned method in accordance with the first embodiment, and FIG. 4B illustrates the result of observing precipitation of boron and phosphorus at a surface of the $O_3$ TEOS BPSG film 13 (see FIG. 1C) formed in accordance with the conventional method. In FIGS. 4A and 4B, black spots indicate boron and phosphorus particles having been precipitated at a surface of the $O_3$ TEOS BPSG films 3 and 13.

As illustrated in FIGS. 3A, 3B, 4A and 4B, it is possible to form a $O_3$ TEOS BPSG film containing boron and phosphorus at higher concentration than that of a conventional interlayer insulating film by employing the above-mentioned method in accordance with the first embodiment to thereby design the upper $O_3$ TEOS BPSG film 3 in the two-layered interlayer insulating film to have a higher ozone concentration than that of the lower $O_3$ TEOS BPSG film 2. It has been confirmed that the interlayer insulating film comprised of the lower and upper $O_3$ TEOS BPSG films 2 and 3 can be sufficiently planarized by reflow process, and that the precipitation of boron and phosphorus at a surface of the interlayer insulating film can be prevented even if the interlayer insulating film were exposed to nitrogen atmosphere in the reflow process.

As mentioned above, in accordance with the above-mentioned first embodiment, an interlayer insulating film disposed between upper and lower wiring layers is designed to have a two-layered structure comprised of the lower and upper films. The upper film is formed in a higher ozone concentration than that of the lower film in the two-layered structure. Hence, the interlayer insulating layer totally has a high concentration of boron (B) and phosphorus (P) than that of a conventional interlayer insulating film, which ensures that the interlayer insulating film can be sufficiently planarized by reflow process.

In addition, by designing the upper film in a higher ozone concentration than that of the lower film, the upper film could have a higher amount of oxygen to thereby facilitate oxidation, which ensures stable film quality. As a result, even if an interlayer insulating film containing boron and phosphorus at higher concentration than a conventional interlayer insulating film were employed, it would be possible to prevent precipitation of boron and phosphorus particles at a surface of the interlayer insulating film after the interlayer insulating film is reflowed, unlike the conventional interlayer insulating films.

The second embodiment is explained hereinbelow with reference again to FIGS. 2A to 2C.

In the second embodiment, a $O_3$ TEOS BPSG film used for planarizing an interlayer insulating film formed between upper and lower wiring layers in a semiconductor device is designed to have a two-layered structure including upper and lower films. The upper film is formed in an ozone ($O_3$) concentration higher than that of the lower film. In addition, the lower and upper films are successively formed. The second embodiment is basically the same as the first embodiment, but is different from the first embodiment only in that the lower and upper films are successively formed.

The steps for fabricating the $O_3$ TEOS BPSG film in the second embodiment are explained hereinbelow with reference again to FIGS. 2A to 2C.

First, as illustrated in FIG. 2A, a polysilicon film 1 is formed on a silicon substrate 4 and patterned. Then, a film 2 made of $O_3$ TEOS BPSG in an atmosphere of ozone ($O_3$) at a relatively low concentration and a film 3 made of $O_3$ TEOS BPSG in an atmosphere ozone ($O_3$) at a relatively high concentration are successively formed over the patterned polysilicon film 1 and the silicon substrate 4 in a certain reaction chamber by normal pressure chemical vapor deposition. In the instant embodiment, the lower $O_3$ TEOS BPSG film 2 is formed in an ozone concentration in the range of 70 mg/litter to 100 mg/litter, and the upper $O_3$ TEOS BPSG film 3 is formed in an ozone concentration in the range of 120 mg/litter to 140 mg/litter. The patterned polysilicon film 1 as a lower wiring layer is completely covered with an interlayer insulating film comprised of the lower and upper $O_3$ TEOS BPSG films 2 and 3.

Then, the lower and upper $O_3$ TEOS BPSG films 2 and 3 are subject to heat treatment by exposing to nitrogen ($N_2$) atmosphere at 800° C. to 900° C. for about 10 minutes, to thereby reflow the lower and upper $O_3$ TEOS BPSG films 2 and 3. Thus, the lower and upper $O_3$ TEOS BPSG films 2 and 3 both of which cooperate with each other to form an interlayer insulating film to be disposed between the lower wiring layer 1 and an upper wiring layer (not illustrated) are planarized, as illustrated in FIG. 2C.

That is, even when the $O_3$ TEOS BPSG film 2 formed in ozone ($O_3$) at a relatively low concentration and the $O_3$ TEOS BPSG film 3 formed in ozone ($O_3$) at a relatively high concentration are successively formed, it is possible to form a $O_3$ TEOS BPSG film containing boron and phosphorus at higher concentration than that of a conventional interlayer insulating film, similarly to the above-mentioned first embodiment. It has been confirmed that the interlayer insulating film comprised of the lower and upper $O_3$ TEOS BPSG films 2 and 3 can be sufficiently planarized by reflow process, and that the precipitation of boron and phosphorus at a surface of the interlayer insulating film can be prevented even if the interlayer insulating film were exposed to nitrogen atmosphere in the reflow process.

As mentioned above, in accordance with the above-mentioned second embodiment, an interlayer insulating film disposed between upper and lower wiring layers is designed to have a two-layered structure comprised of the lower and upper films. The upper film is formed in a higher ozone concentration than that of the lower film in the two-layered structure, and in addition, the lower and upper films are successively formed. Hence, the interlayer insulating layer totally has a high concentration of boron (B) and phosphorus (P) than that of a conventional interlayer insulating film, which ensures that the interlayer insulating film can be sufficiently planarized by reflow process, similarly to the first embodiment.

In addition, by designing the upper film 3 to have a higher ozone concentration than that of the lower film 2, the upper film 3 could have a higher amount of oxygen to thereby facilitate oxidation, which ensures stable film quality. As a result, even if an interlayer insulating film containing boron and phosphorus at higher concentration than a conventional interlayer insulating film were employed, it would be possible to prevent precipitation of boron and phosphorus particles at a surface of the interlayer insulating film after the interlayer insulating film is reflowed, unlike the conventional interlayer insulating films.

The specific ozone concentrations, 70–100 mg/litter for the lower film 2 and 120–140 mg/litter for the upper film 3 set forth in the above-mentioned first and second embodiments, are merely an example, and it should be noted that the ozone concentration in the lower and upper films 2 and 3 are not to be limited to those. The ozone concentration in the lower and upper films may be optionally determined, unless the upper film is formed in a higher ozone concentration than that of the lower film.

Similarly, material of which an interlayer insulating film having a two-layered structure is made is not to be limited to $O_3$ TEOS BPSG. The interlayer insulating film comprising the lower and upper films 2 and 3 may be composed of any other material, unless it is electrically insulative.

In addition, an interlayer insulating film in the first and second embodiments is exemplified as having the two-layered structure comprised of the lower and upper films 2 and 3. However, those skilled in the art would readily understand that the interlayer insulating film may have a multi-layered structure including three or more films, in which case, it is preferable a top film is formed in the highest ozone concentration among all the films.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-268657 filed on Oct. 9, 1996 including specification, claims, drawings and summary is incorporated herein by reference in its entirety.

What is claimed is:

1. A semiconductor device comprising:

an interlayer insulating film disposed between upper and lower wiring layers, said interlayer insulating film having a two-layered structure including an upper insulating film and a lower insulating film, said upper and lower insulating films each being formed from an $O_3$ tetra etyl ortho silicate (TEOS) reaction, said upper insulating film formed in an atmosphere containing ozone ($O_3$) at a concentration higher than in an atmosphere in which said lower insulating film is formed, said upper and lower insulating films containing an impurity therein, said upper insulating film containing said impurity at a concentration higher than that of said lower insulating film, wherein said upper insulating film includes a surface having a reduced concentration of impurity particles as a result of said upper insulating film having been formed in said atmosphere containing a greater concentration of ozone than in said atmosphere in which said lower insulating film was formed.

2. The semiconductor device as set forth in claim 1, wherein said interlayer insulating film is composed of BPSG (boron phospho silicate glass) formed from said $O_3$ TEOS reaction.

3. The semiconductor device as set forth in claim 1, wherein said upper insulating film is formed in an atmosphere containing ozone at a concentration ranging from 120 to 140 mg/liter both inclusive, and said lower insulating film is formed in an atmosphere containing ozone at a concentration ranging from 70 to 100 mg/liter both inclusive.

4. A semiconductor device comprising:

an interlayer insulating film disposed between upper and lower wiring layers, and said interlayer insulating film having a multi-layered structure including a plurality of insulating films each formed from an $O_3$ tetra etyl ortho silicate (TEOS) reaction, wherein said insulating films include a first insulating film formed in an atmosphere containing ozone ($O_3$) at a concentration higher than in an atmosphere in which a second insulating film disposed therebelow is formed, and wherein at least said first and second insulating films contain an impurity therein, said first insulating film containing said impurity at a concentration higher than that of an insulating film disposed therebelow, wherein said first insulating film includes a surface having a reduced concentration of impurity particles as a result of said first insulating film having been formed in said atmosphere containing a greater concentration of ozone than in said atmosphere in which said second insulating film was formed.

5. The semiconductor device as set forth in claim 4, wherein said interlayer insulating film is composed of BPSG (boron phospho silicate glass) formed from said $O_3$ TEOS reaction.

6. The semiconductor device as set forth in claim 4, wherein an uppermost insulating film in said multi-layered structure is formed in an atmosphere containing ozone at a concentration ranging from 120 to 140 mg/liter both inclusive, and an lowermost insulating film in said multi-layered structure is formed in an atmosphere containing ozone at a concentration ranging from 70 to 100 mg/liter both inclusive.

7. The semiconductor device as set forth in claim 1, wherein said upper insulating film contains an amount of oxygen higher than an amount of oxygen contained in said lower insulating film.

8. The semiconductor device as set forth in claim 1, wherein said first insulating film contains an amount of oxygen higher than an amount of oxygen contained in said second insulating film.

* * * * *